(12) United States Patent
Lee (10) Patent No.: US 11,805,621 B2
(45) Date of Patent: Oct. 31, 2023

(54) MEMORY AUXILIARY HEAT TRANSFER STRUCTURE

(71) Applicant: ASIA VITAL COMPONENTS (CHINA) CO., LTD., Shenzhen (CN)

(72) Inventor: Sung-Wei Lee, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 114 days.

(21) Appl. No.: 16/784,265

(22) Filed: Feb. 7, 2020

(65) Prior Publication Data

US 2021/0251105 A1 Aug. 12, 2021

(51) Int. Cl.
*H05K 7/20* (2006.01)
*G06F 1/20* (2006.01)
*F28F 13/00* (2006.01)
*H01L 23/433* (2006.01)

(52) U.S. Cl.
CPC ......... *H05K 7/20272* (2013.01); *F28F 13/00* (2013.01); *G06F 1/20* (2013.01); *H01L 23/433* (2013.01); *F28F 2013/005* (2013.01)

(58) Field of Classification Search
CPC .... F28F 13/00; F28F 13/005; H05K 7/20272; G06F 1/20; H01L 23/433
See application file for complete search history.

(56) References Cited

U.S. PATENT DOCUMENTS

| | | | | | |
|---|---|---|---|---|---|
| 4,771,366 | A | * | 9/1988 | Blake | H05K 7/023 257/713 |
| 7,599,187 | B2 | * | 10/2009 | Aoki | H01L 23/433 361/719 |
| 7,606,049 | B2 | * | 10/2009 | Goodwin | G06F 1/184 361/783 |
| 7,609,523 | B1 | * | 10/2009 | Ni | H01L 23/3672 257/707 |

(Continued)

FOREIGN PATENT DOCUMENTS

| CN | 102419623 B | | 3/2014 |
|---|---|---|---|
| JP | 2001196516 A | * | 7/2001 |

(Continued)

OTHER PUBLICATIONS

Koike, Hiroko, "Heat Spreader", Jul. 19, 2001, Entire Document (translation of JP 2001196516) (Year: 2001).*

(Continued)

*Primary Examiner* — Mandeep S Buttar
(74) *Attorney, Agent, or Firm* — Brad J. Thorson; DeWitt LLP (57) ABSTRACT

A memory auxiliary heat transfer structure is correspondingly assembled with at least one memory unit and a water-cooling assembly. The memory auxiliary heat transfer structure includes a main body. The main body has a first end, a second end and a middle section. The middle section has a heated side and a contact side. The heated side is disposed corresponding to at least one chip disposed on the memory unit. The contact side is attached to and assembled (Continued)

with the water-cooling assembly. The memory auxiliary heat transfer structure serves to reduce the friction between the memory unit and the water-cooling assembly and fill the gap so as to reduce the heat resistance.

4 Claims, 7 Drawing Sheets

(56) References Cited

U.S. PATENT DOCUMENTS

| | | | | |
|---|---|---|---|---|
| 8,081,473 B2* | 12/2011 | Cipolla | ............... | H01L 23/473 |
| | | | | 361/679.52 |
| 8,659,897 B2* | 2/2014 | Meijer | ............... | G06F 1/20 |
| | | | | 361/721 |
| 10,021,814 B2* | 7/2018 | Aoki | ............... | H05K 7/2039 |
| 10,705,578 B2* | 7/2020 | Franz | ............... | H10B 12/01 |
| 11,206,749 B2* | 12/2021 | Kinsley | ............... | H05K 7/20436 |
| 11,246,236 B2* | 2/2022 | Urai | ............... | H05K 7/20272 |
| 2005/0141199 A1* | 6/2005 | Chiou | ............... | H01L 23/3672 |
| | | | | 361/704 |
| 2005/0151555 A1* | 7/2005 | Lewis | ............... | F25B 9/145 |
| | | | | 361/676 |
| 2006/0067054 A1* | 3/2006 | Wang | ............... | H01L 23/42 |
| | | | | 361/704 |
| 2009/0002951 A1* | 1/2009 | Legen | ............... | H01L 23/427 |
| | | | | 165/104.33 |
| 2012/0020004 A1* | 1/2012 | Rau | ............... | H01L 23/473 |
| | | | | 361/679.31 |
| 2018/0059744 A1* | 3/2018 | Brazel | ............... | H05K 7/20336 |
| 2021/0037679 A1* | 2/2021 | Kinsley | ............... | H01L 23/3672 |

FOREIGN PATENT DOCUMENTS

| | | |
|---|---|---|
| TW | M559045 U | 4/2018 |
| TW | M559401 U | 5/2018 |
| TW | M560170 U | 5/2018 |
| TW | M582155 U | 8/2019 |

OTHER PUBLICATIONS

Engineering ToolBox, (2008). Ceramic Materials—Properties. [online] Available at: https://www.engineeringtoolbox.com/ceramics-properties-d_1227.html [Accessed Day Mo. Year]. (Year: 2008).*

Search Report dated Jun. 10, 2021 issued by Taiwan Intellectual Property Office for counterpart application No. 109100181.

* cited by examiner

MEMORY AUXILIARY HEAT TRANSFER STRUCTURE

BACKGROUND OF THE INVENTION

1. Field of the Invention

The present invention relates generally to a memory auxiliary heat transfer structure, and more particularly to a memory auxiliary heat transfer structure, which has wear resistance and high heat transfer coefficient to reduce the heat resistance.

2. Description of the Related Art

The current electronic apparatuses have many electronic chips inside for calculating data. These electronic chips are exactly the heat generation components in the electronic apparatus. In general, to dissipate the heat generated by the heat generation components, a conventional heat transfer component (heat pipe, vapor chamber, heat sink, etc.) is used to directly contact the heat source and a cooling fan is correspondingly disposed to forcedly dissipate the heat of the heat transfer component. However, with the advance of the electronic chips with stronger and stronger calculation capability, the heat generated by the electronic chips is also greatly increased. Therefore, the conventional heat dissipation means can hardly satisfy the heat dissipation requirement and a water-cooling means must be employed to dissipate the heat.

In the water-cooling system, a water-cooling pipeline is disposed in the electronic apparatus and a water-cooling radiator is used to absorb heat for heat exchange. However, one of the heat sources (memory unit) in the electronic apparatus has multiple chips on the surface. The chips must be directly attached to the water-cooling radiator or water-cooling set to absorb the heat and achieve cooling effect. Once the water-cooling set is assembled, it is quite hard to rework. Therefore, it is impossible for a common user himself/herself to replace the internal damaged electronic component such as the memory unit. Therefore, it is necessary to send the entire electronic apparatus back to the original factory for the original factory to replace the memory unit and the other electronic components. This is quite inconvenient.

Moreover, due to the frequent insertion/extraction, the outer surface of the external case (metal or ceramic material) packaging the memory chip will contact and abrade the water-cooling set. As a result, scrapes are often formed on the surface of the external case packaging the memory chip to cause heat resistance or damage the external case to expose the memory chip and contaminate the memory chip.

Furthermore, the surface of the pipeline of the water-cooling set is apt to abrade the external case packaging the memory chip so that the pipeline of the water-cooling set is easy to damage to cause leakage and short-circuit and burnout of the memory. In both the assembling and reworking processes, the abrasion will cause the above problems to be improved.

It is therefore tried by the applicant to provide a memory auxiliary heat transfer structure to solve the problems existing in the heat dissipation of the electronic apparatus and enable a user himself/herself to solve the malfunction of the electronic components.

SUMMARY OF THE INVENTION

It is therefore a primary object of the present invention to provide a memory auxiliary heat transfer structure, which can enhance the wear resistance of the surface of the chip of the memory and the surface of the water-cooling assembly and increase heat transfer coefficient to reduce the heat resistance.

To achieve the above and other objects, the memory auxiliary heat transfer structure of the present invention is correspondingly assembled with at least one memory unit and a water-cooling assembly. The memory auxiliary heat transfer structure includes a main body.

The main body has a first end, a second end and a middle section. Two ends of the middle section extend to connect with the first and second ends. The middle section has a heated side and a contact side. The first and second ends are disposed corresponding to the memory unit. The heated side is disposed corresponding to at least one chip disposed on the memory unit. The contact side is attached to and assembled with the water-cooling assembly.

When the heat of the memory is dissipated by means of the water-cooling assembly, the memory auxiliary heat transfer structure of the present invention is disposed between the water-cooling assembly and the memory unit so as to increase the wear resistance of the chip of the memory unit and the surface of the water-cooling assembly and fill the gap. Also, the memory auxiliary heat transfer structure of the present invention can provide better wear resistance and thermo-conductivity, whereby a user himself/herself can replace the memory unit many times without damaging the water-cooling assembly and the chip of the memory unit.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
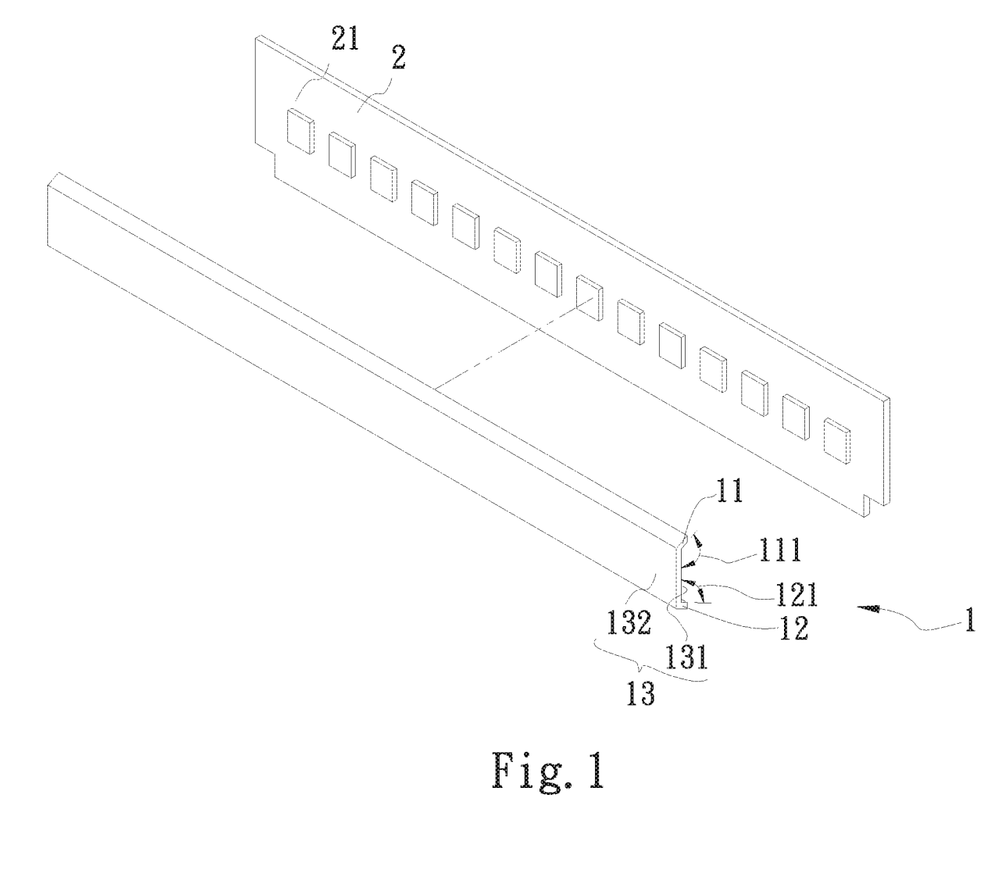
FIG. 1 is a perspective exploded view of a first embodiment of the memory auxiliary heat transfer structure of the present invention.
Figure 1A:
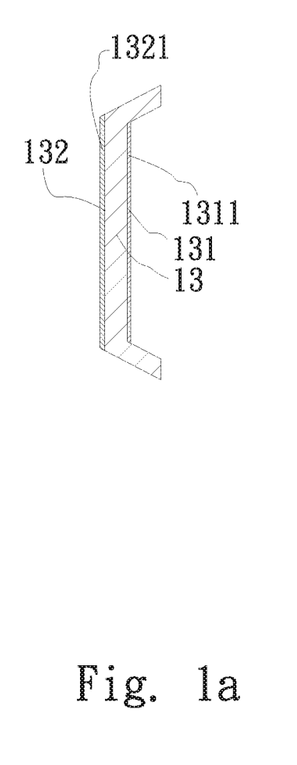
FIG. 1a is a sectional view of the first embodiment of the memory auxiliary heat transfer structure of the present invention.
Figure 2:
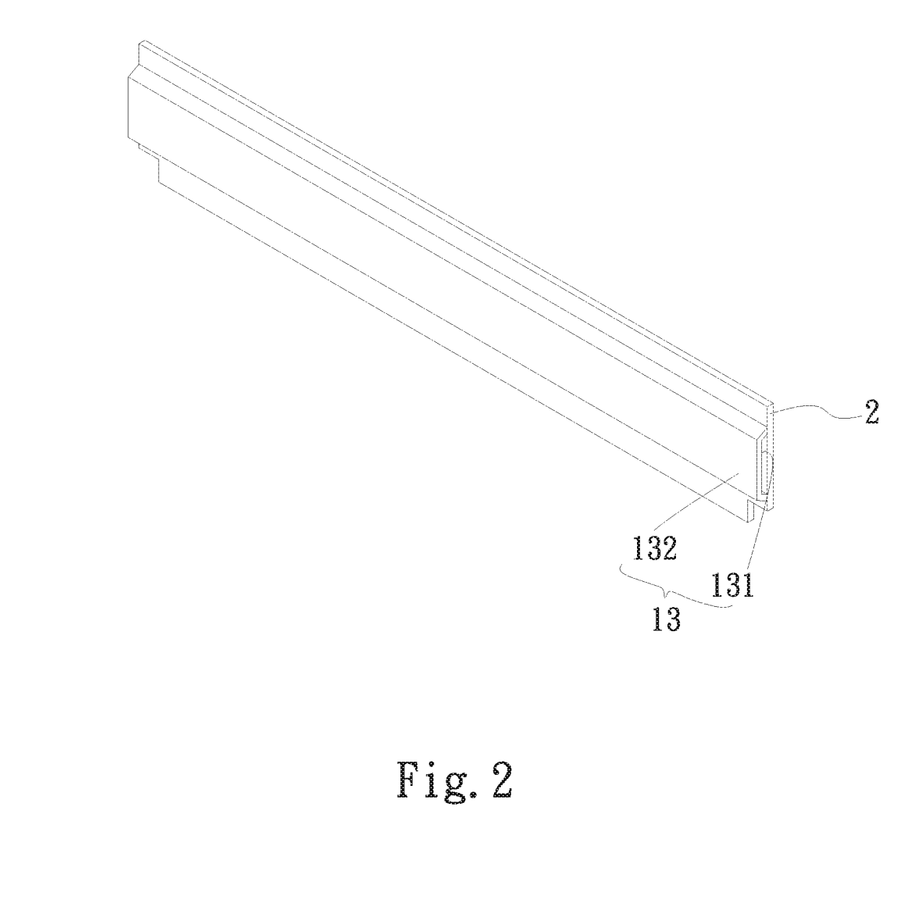
FIG. 2 is a perspective assembled view of the first embodiment of the memory auxiliary heat transfer structure of the present invention.

Please refer to FIGS. 1, 1a and 2. FIG. 1 is a perspective exploded view of a first embodiment of the memory auxiliary heat transfer structure of the present invention. FIG. 1a is a sectional view of the first embodiment of the memory auxiliary heat transfer structure of the present invention. FIG. 2 is a perspective assembled view of the first embodiment of the memory auxiliary heat transfer structure of the present invention. According to the first embodiment, the memory auxiliary heat transfer structure of the present invention is correspondingly assembled with at least one memory unit and a water-cooling assembly. The memory auxiliary heat transfer structure includes a main body 1.

The main body 1 has a first end 11, a second end 12 and a middle section 13. Two ends of the middle section 13 extend to connect with the first and second ends 11, 12. Angles are contained between the middle section 13 and the first and second ends 11, 12. Alternatively, a curved face or an arched face is formed between the middle section 13 and the first and second ends 11, 12. The angles include a first angle 111 and a second angle 121. The first and second angles 111, 121 are larger than or equal to 90 degrees. The first and second ends 11, 12 are disposed corresponding to the memory unit 2.

The middle section 13 has a heated side 131 and a contact side 132 respectively positioned on two sides of the middle section 13. The heated side 131 is disposed corresponding to at least one chip 21 on the memory unit 2. The contact side 132 is attached to and assembled with the water-cooling assembly 3.

The contact side 132 of the middle section 13 has a wear-resistant layer 1321. The wear-resistant layer 1321 is formed on the contact side 132 by means of electroplating, surface treatment or coating. The wear-resistant layer 1321 serves to increase the wear resistance of the contact side 132. The main body 1 has elasticity, whereby when an external force is applied to the middle section 13, the middle section 13 is tightly attached to the surface of the chip 21 on the memory unit 2. When the external force disappears, the middle section 13 is restored to its original state to separate from the surface of the chip 21 on the memory unit 2. The heated side 131 has a thermo-conductive medium 1311. The thermo-conductive medium 1311 is selected from a group consisting of silver heat dissipation paste, copper foam, aluminum foam, thermo-conductive adhesive (paste) and gap pad.

The main body 1 is made of a material with better thermo-conductivity, which is selected from a group consisting of gold, silver, copper, iron, aluminum, titanium, copper alloy, aluminum alloy, titanium alloy, graphite and ceramic material.

Figure 3:
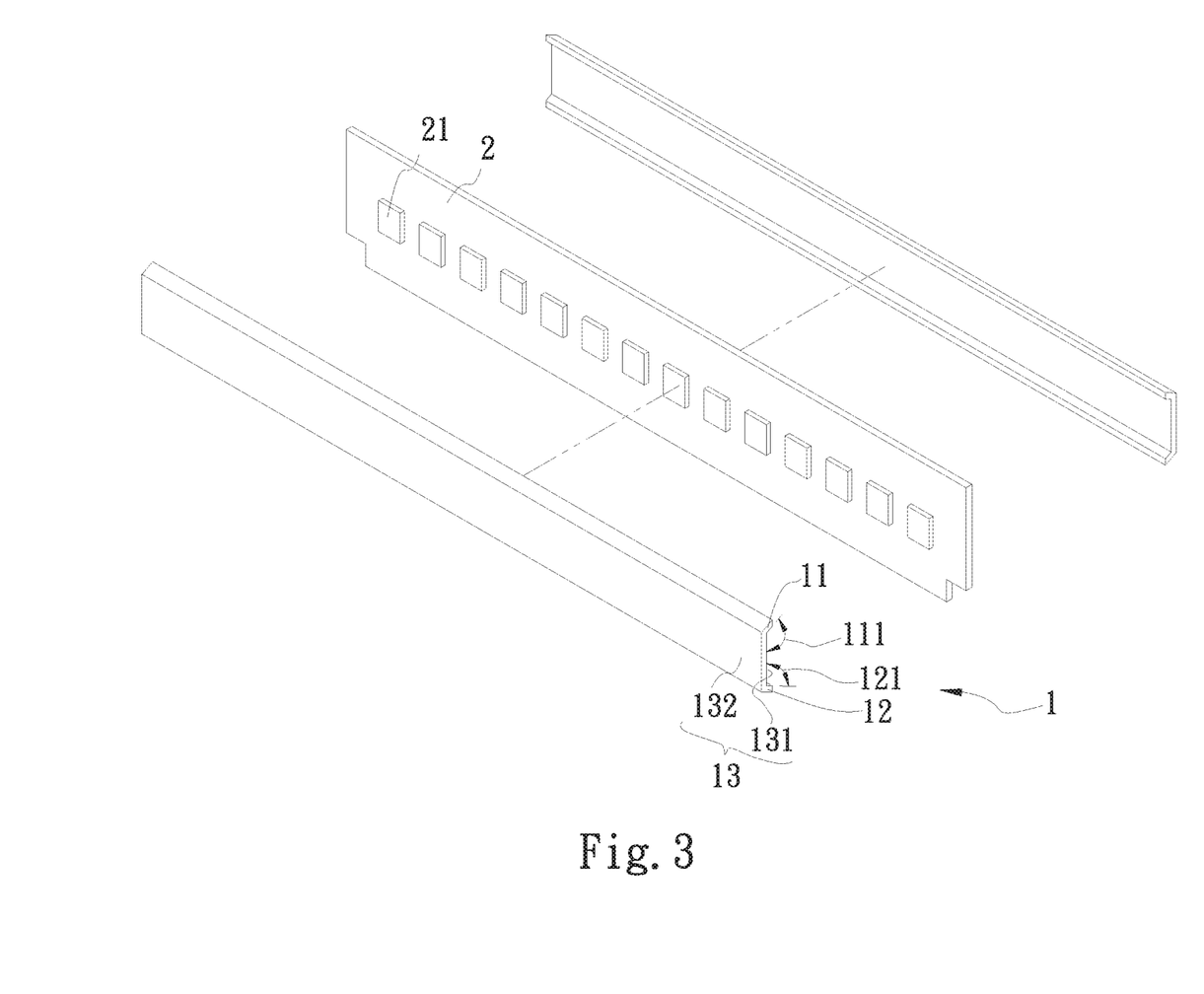
FIG. 3 is a perspective exploded view of a second embodiment of the memory auxiliary heat transfer structure of the present invention.

The first and second ends 11, 12 of the main body 1 are in an inclined state. The water-cooling assembly 3 is a water-cooling tube. The contact side 132 is in contact and connection with the water-cooling assembly 3 by frictional means of insertion (engagement) as shown in FIG. 3. In addition, via the slopes or curved faces between the first end 11 or the second end 12 and the main body 1, the main body 1 can be more conveniently guided into and assembled/connected with the water-cooling assembly 3.

Please now refer to FIG. 3, which is a perspective exploded view of a second embodiment of the memory auxiliary heat transfer structure of the present invention. The second embodiment is partially identical to the first embodiment and thus will not be redundantly described hereinafter. The second embodiment is different from the first embodiment in that multiple chips 21 are disposed on both front and rear sides (or left and right sides) of the memory unit 2. In this embodiment, two main bodies 1 are attached to the front and rear sides of the memory unit 2. When an external force is applied to the middle section 13 of the main body 1 to pressurize the middle section 13, the heated side 131 of the middle section 13 gets close to the chips 21 to directly attach thereto (connect therewith). Accordingly, the main bodies 1 can conduct heat from both sides of the memory unit 2.

Figure 4:
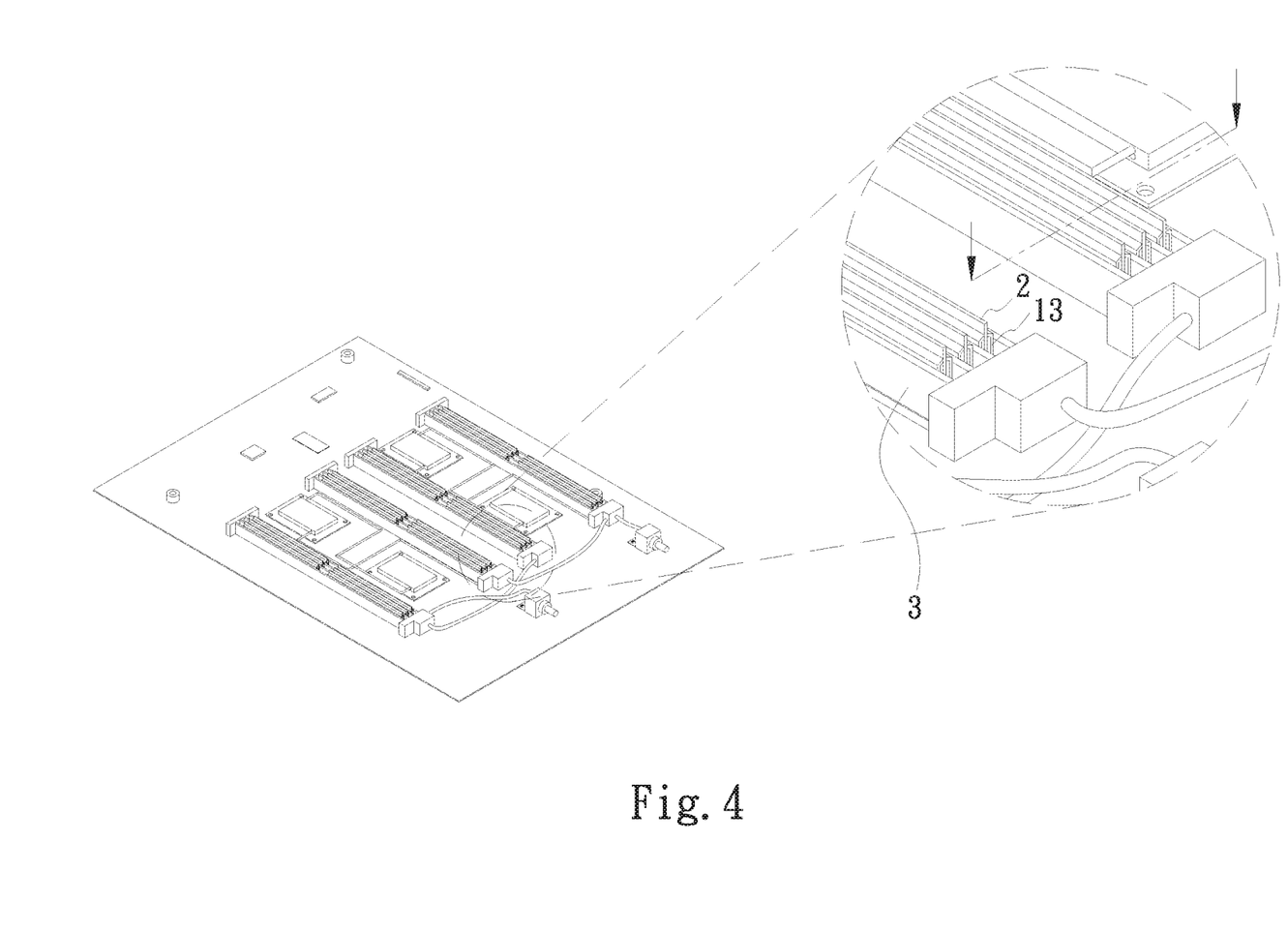
FIG. 4 is a perspective view showing the operation of the memory auxiliary heat transfer structure of the present invention.
Figure 5:
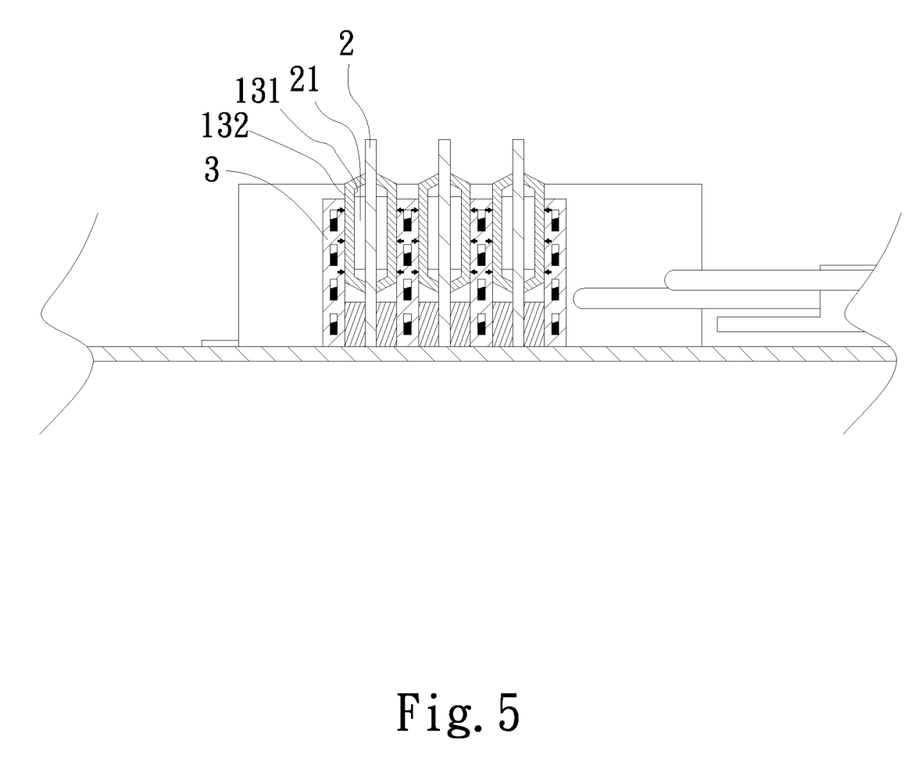
FIG. 5 is a sectional view of the memory auxiliary heat transfer structure of the present invention.
Figure 6:
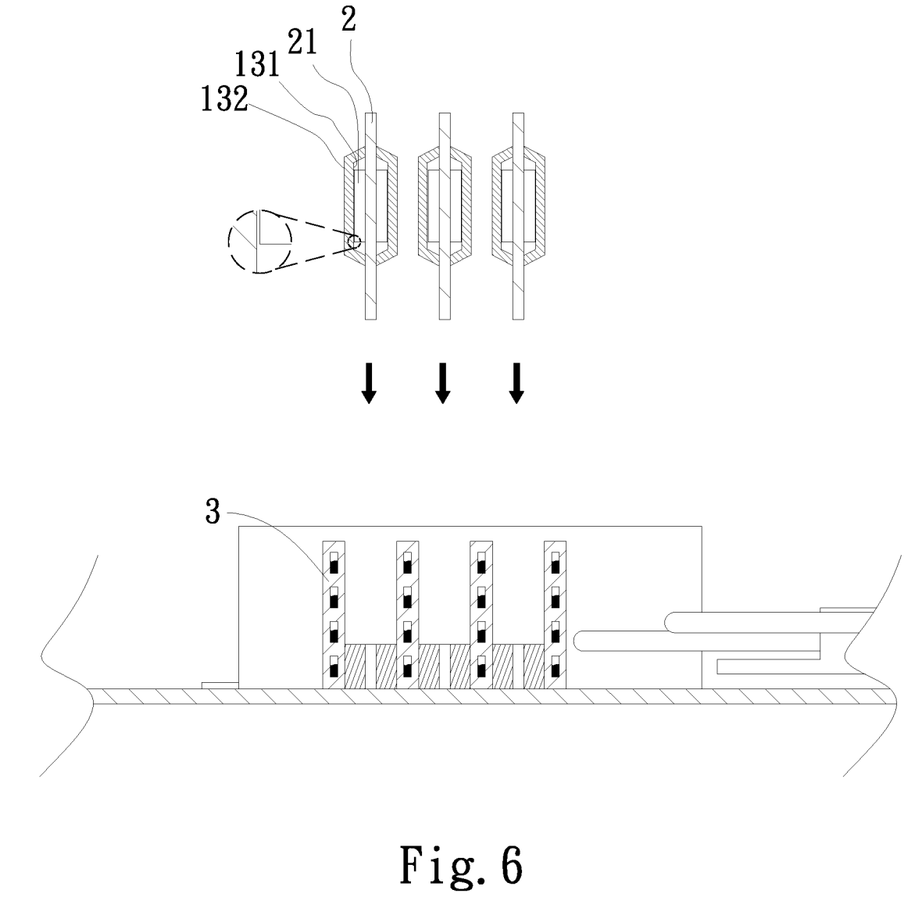
FIG. 6 is a sectional view of the memory auxiliary heat transfer structure with the middle section of the present invention.

Please now refer to FIGS. 4 and 5. FIG. 4 is a perspective view showing the operation of the memory auxiliary heat transfer structure of the present invention. FIG. 5 is a sectional view of the memory auxiliary heat transfer structure of the present invention. As shown in the drawings, the memory auxiliary heat transfer structure of the present invention is mainly applied to the memory of an electronic apparatus. When the electronic apparatus employs a water-cooling means to dissipate the heat, a filling medium must be disposed between the memory unit 2 and the water-cooling assembly 3 as a heat contact to transfer the heat. In the present invention, the main body 1 serves as the filling medium disposed between the memory unit 2 and the water-cooling assembly 3. When assembling the memory unit 2, the main body 1 is inlaid at the same time, whereby the main body 1 is disposed in the gap between the memory unit 2 and the water-cooling assembly 3 (water-cooling tube and water-cooling radiator). In addition, when the main body 1 is inlaid in the gap between the memory unit 2 and the water-cooling assembly 3, the middle section of the main body 1 is compressed and deformed, whereby the contact side 132 of the middle section 13 frictionally contacts the water-cooling assembly 3 and attaches thereto. The heated side 131 on the other side is compressed to attach to and contact the chips 21 on the memory unit 2 to conduct the heat. The contact side 132 must employ a frictional means to connect with the water-cooling assembly 3. Therefore, by means of surface treatment, the wear resistance of the contact side 132 is increased and or the frictional coefficient of the contact side 132 is reduced. Accordingly, the contact side 132 is prevented from being damaged and the water-cooling assembly 3 is prevented from being over-worn.

In addition, the thermo-conductive medium 1311 is further disposed on the heated side 131 (as shown in FIG. 1a). The thermo-conductive medium 1311 is selected from a group consisting of silver heat dissipation paste, copper foam, aluminum foam, thermo-conductive adhesive (paste) and gap pad so as to increase the heat conduction efficiency and avoid excessive gap to cause heat resistance.

The present invention mainly improves the attachment section between the memory unit and the water-cooling system employed by an electronic apparatus. After the conventional water-cooling system is modularized, many electronic components are directly held and tightly secured by the pipelines in the water-cooling system. Therefore, the water-cooling system cannot be removed so that a user himself/herself cannot replace the electronic components. The present invention improves the shortcoming of the conventional water-cooling system that the user himself/herself cannot replace the electronic components of the electronic apparatus. Also, the present invention enhances the wear resistance between the memory chips and the water-cooling assembly and facilitates the insertion/extraction so as to greatly enhance the convenience.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A memory auxiliary heat transfer structure correspondingly assembled with at least one memory unit and a water-cooling assembly, the memory auxiliary heat transfer structure comprising:

an elastic main body having a first end, a second end and a middle section, two ends of the middle section extending to connect with the first and second ends, a first angle and a second angle being contained between the middle section and the first and second ends respectively, and the first and second angles being larger than 90 degrees so that the first and second ends of the elastic main body are in an inclined state, the middle section having a heated side and a contact side, the heated side being disposed corresponding to at least one chip disposed on the at least one memory unit, the contact side being assembled with the water-cooling assembly, and the elastic main body being guided into and assembled with the water-cooling assembly via the first and second ends;

wherein the elastic main body is inlaid in a gap between the memory unit and the water-cooling assembly serving as a filling medium, and when an external force is applied to the middle section of the elastic main body, the middle section of the elastic main body is compressed and deformed from a first position wherein the middle section is separated from a surface of the at least one chip, to a second position wherein the middle section is attached to the surface of the chip, and the middle section returns to the first position when the external force is removed.

2. The memory auxiliary heat transfer structure as claimed in claim 1, wherein the contact side has a wear-resistant layer, the wear-resistant layer being formed on the contact side by means of electroplating, surface treatment or coating.

3. The memory auxiliary heat transfer structure as claimed in claim 1, wherein the heated side has a thermo-conductive medium, the thermo-conductive medium being selected from a group consisting of silver heat dissipation paste, copper foam, aluminum foam, thermo-conductive adhesive (paste) and gap pad.

4. The memory auxiliary heat transfer structure as claimed in claim 1, wherein the water-cooling assembly is a water-cooling tube, the contact side being in contact and connection with the water-cooling assembly by a frictional means.

* * * * *